United States Patent
Higashino

(10) Patent No.: US 7,468,940 B2
(45) Date of Patent: Dec. 23, 2008

(54) ITR DATA REPRODUCING APPARATUS, RECORD/REPRODUCING SYSTEM, AND INTERPOLATION FILTER

(75) Inventor: Satoru Higashino, Tokyo (JP)

(73) Assignee: Sony Corporation (JP)

( * ) Notice: Subject to any disclaimer, the term of this patent is extended or adjusted under 35 U.S.C. 154(b) by 370 days.

(21) Appl. No.: 10/572,073

(22) PCT Filed: Sep. 29, 2004

(86) PCT No.: PCT/JP2004/014681

§ 371 (c)(1),
(2), (4) Date: Mar. 15, 2006

(87) PCT Pub. No.: WO2005/031738

PCT Pub. Date: Apr. 7, 2005

(65) Prior Publication Data

US 2007/0035867 A1    Feb. 15, 2007

(30) Foreign Application Priority Data

Sep. 29, 2003  (JP) .............................. 2003-337719

(51) Int. Cl.
G11B 7/00  (2006.01)
(52) U.S. Cl. ............... 369/59.22; 369/124.05
(58) Field of Classification Search .............. 369/59.16, 369/59.19, 59.21, 59.22, 124.05, 125.08, 369/124.08
See application file for complete search history.

(56) References Cited

U.S. PATENT DOCUMENTS 6,819,514 B1 * 11/2004 Behrens et al. ............... 360/65

FOREIGN PATENT DOCUMENTS

| JP | 05-227042 | 9/1993 |
| JP | 08-007489 | 1/1996 |
| JP | 2001-184795 | 7/2001 |
| JP | 3255179 B2 | 11/2001 |

OTHER PUBLICATIONS

International Search Report mailed Jan. 18, 2005.

(Continued)

*Primary Examiner*—Nabil Z Hindi
(74) *Attorney, Agent, or Firm*—Rader Fishman & Grauer PLLC; Ronald P. Kananen

(57) ABSTRACT

An ITR (Interpolated Timing Recovery) data reproducing apparatus capable of acquiring an excellent reproduction output waveform with less distortion and updating sampling timing at high speed with a simple configuration is provided. Each sampling period (Ts) of a desired interpolation function f(t) is split into a plurality of periods, linear interpolation is performed for each of the split periods, and data at each interpolation point within each of the split periods is calculated. In addition, only a binary integer representation part is extracted as a quotient obtained by performing integer division of sampling timing for a sampling period, and only input sampling data (Ds) for a number of the binary integer representation part is captured into an interpolation filter to operate a pipeline. Only a binary fraction representation part is extracted as a remainder obtained by performing integer division of the sampling timing for the sampling period, and a tap coefficient of the interpolation filter is determined in accordance with the extracted value, which is used as sampling timing (μk).

10 Claims, 19 Drawing Sheets

OTHER PUBLICATIONS

International Written Opinion mailed Jan. 18, 2005.

European Search Report, Application No./Patent No. 04788453.1-2223 PCT/JP2004014681, dated Sep. 18, 2006.

Smith, J. O. et al., "A Flexible Sampling-Rate Conversion Method" International Conference On Acoustics, Speech & Signal Processing. ICASSP. San Diego, Mar. 19-21, 1984, New York, IEEE, US, vol. vol. 2 Conference 9, Mar. 1984, pp. 19401-19404, XP000946290.

Vesma J. et al., "Interpolation Filters with Arbitrary Frequency Response For All-Digital Receivers" 1996 IEEE International Symposium on Circuits and Systems (ISCAS). Circuits and a Systems Connecting the World. Atlanta, May 12-15, 1996, pp. 568-571, XP000948193, ISBN: 0-7803-3074-9.

Bucket K. et al., "Communication Theory the Effect of Non-Ideal Interpolation on Symbol Synchronizer Performance" European Transaction on Telecommunications and related technologies, AEI, Milano, IT, vol. 6, No. 6, Nov. 1, 1995, pp. 627-632, XP000544997, ISSN: 1120-3862.

JiangJiang Wang: Chapter 7 of Timing Recovery Techniques for Digital Recording Systems: [Online] 2002, pp. 1-30, XP002395886 Retrieved from the Internet: URL:alexandria.tue.nl/extra2/200213782.pdf [retrieved on Aug. 23, 2006], paragraph [07.2].

M. Abramowitz and I. Stegun: Handbook of Mathematical Functions: Dover Publications, 1970, XP002395888, p. X.

Japanese Office Action dated Apr. 9, 2008 for corresponding Japanese Application No. 2003-337719.

* cited by examiner

| 0 | $q(0,0)=1$<br>$q(0,1)=0.900316$<br>$q(0,2)=0.63662$<br>$q(0,3)=0.300105$<br>$q(0,4)=q(1,0)$ |
| --- | --- |
| 1 | $q(1,0)=0$<br>$q(1,1)=-0.18006$<br>$q(1,2)=-0.21221$<br>$q(1,3)=-0.12862$<br>$q(1,4)=q(2,0)$ |
| 2 | $q(2,0)=0$<br>$q(2,1)=0.100035$<br>$q(2,2)=0.127324$<br>$q(2,3)=0.081847$<br>$q(2,4)=q(3,0)$ |
| 3 | $q(3,0)=0$<br>$q(3,1)=-0.06926$<br>$q(3,2)=-0.09095$<br>$q(3,3)=-0.06002$<br>$q(3,4)=q(4,0)$ |
| 4 | $q(4,0)=0$<br>$q(4,1)=0.05296$<br>$q(4,2)=0.070736$<br>$q(4,3)=0.047385$<br>$q(4,4)=q(5,0)=0$ |

| | |
|---|---|
| 0 | $q(0,0) = 1$<br>$q(0,1) = 0.820313$<br>$q(0,2) = 0.625$<br>$q(0,3) = 0.273438$<br>$q(0,4) = q(1,0)$ |
| 1 | $q(1,0) = 0$<br>$q(1,1) = -0.05469$<br>$q(1,2) = -0.0625$<br>$q(1,3) = -0.03906$<br>$q(1,4) = 0$ |

| | |
|---|---|
| 0 | $q(0,0)=1$<br>$q(0,1)=0.84375$<br>$q(0,2)=0.625$<br>$q(0,3)=0.34375$<br>$q(0,4)=q(1,0)$ |
| 1 | $q(1,0)=0$<br>$q(1,1)=-0.09375$<br>$q(1,2)=-0.125$<br>$q(1,3)=-0.09375$<br>$q(1,4)=0$ |

DATA IDENTIFICATION POINT $$\Delta \tau k = -yk \cdot a(k-1) + y(k-1) \cdot ak \cdots (9)$$

$$\nu k = \alpha \cdot \Delta\tau k + \Delta T k \quad \cdots (11)$$

$$\Delta T k = \Delta T(k-1) + \rho \cdot \Delta\tau(k-1) \quad \cdots (12)$$

ITR DATA REPRODUCING APPARATUS, RECORD/REPRODUCING SYSTEM, AND INTERPOLATION FILTER

TECHNICAL FIELD

The present invention relates to an ITR (Interpolated Timing Recovery) data reproducing apparatus, a recording/reproducing system including the ITR data reproducing apparatus, and an interpolation filter used for the ITR data reproducing apparatus or the like.

BACKGROUND ART

When digital data is recorded on a recording medium, such as a magnetic disc or an optical disc, and reproduced from the recording medium, a reproduction waveform read from the recording medium is sampled, and a sampled value is converted into data (sampling data). Accordingly, recorded data is reproduced.

In this case, in order to reproduce data at the original sampling timing, a method, using a PLL (Phase Locked Loop), for predicting an identification point of data, generating a sampling clock corresponding to the point, and sampling a reproduction waveform is used.

In particular, for magnetic recording/reproduction, a paper titled "A PRML System for Digital Magnetic Recording" written by Roy D. Cideciyan et al. in IEEE JOURNAL ON SELECTED AREAS IN COMMUNICATIONS, VOL. 10, NO. 1, January 1992 (document 1) shows an example in which such a PLL data reproducing apparatus realizes PR4 as a PR (Partial Response).

FIG. 16 shows the PLL data reproducing apparatus. An input reproduction waveform Si is a signal having an analog waveform represented by a broken line shown in FIG. 17. According to the PLL data reproducing apparatus shown in FIG. 16, in an A/D converter circuit 61, the reproduction waveform Si is sampled in accordance with a sampling clock CLs supplied from a VCO (Voltage Controlled Oscillator) 62, and the sampled value is converted into sampling data Ds.

The sampling data Ds is equalized by a PR equalization circuit 71 formed by an FIR (Finite Impulse Response) filter, and a phase error of output data of the PR equalization circuit 71 is detected by a phase detection circuit 72. The detection result is converted, by an LPF (Low Pass Filter) 73 into data for controlling an oscillation frequency of the VCO 62.

The control data output from the LPF 73 is converted into an analog control voltage by a D/A converter circuit 63, and the oscillation frequency of the VCO 62 is controlled in accordance with the control voltage.

Thus, the phase of the sampling clock-CLs supplied from the VCO 62 is locked to the phase of the original sampling timing, which is represented by a solid line shown in FIG. 17. Accordingly, data at the original sampling timing is reproduced.

In the PLL data reproducing apparatus, however, the PLL is formed by both an analog section 60 that includes the A/D converter circuit 61, the VCO 62, and the D/A converter circuit 63 and a digital section 70 that includes the PR equalization circuit 71, the phase detection circuit 72, and the LPF 73, as shown in FIG. 16. Thus, the configuration of the system is complicated. Furthermore, since the characteristics of the VCO 62 vary depending on the temperature and the like, it is difficult to expect a stable operation.

Thus, ITR systems described in a paper titled "Interpolation in Digital Modems-Part 1: Fundamentals" written by Floyd M. Gardner in IEEE TRANSACTIONS VOL. 41, NO. 3, MARCH 1993 (document 2) and a paper titled "Interpolation in Digital Modems-Part 2: Implementation and Performance" written by Lars Erup et al. in IEEE TRANSACTIONS, VOL. 41, NO. 6, June 1993 (document 3) are proposed.

FIG. 18 shows such an ITR data reproducing apparatus. According to the ITR data reproducing apparatus, in an A/D converter circuit 81, a reproduction waveform Si is sampled in accordance with a sampling clock CLs supplied from an oscillator 82, and the sampled value is converted into sampling data Ds. The oscillator 82 is a fixed oscillator, not a VCO.

The sampling data Ds output from the A/D converter circuit 81 is supplied to an ITR section 90. The ITR section 90 forms a digital PLL by an interpolation filter 91, a PR equalization circuit 92, a phase detection circuit 93, a LPF 94, and a controller 95.

In accordance with data that is output from the controller 95 and that indicates the timing of each point Pt splitting a sampling period (sampling interval) Ts shown in FIG. 19, based on an interpolation method, which will be described below, the interpolation filter 91 outputs the value of the reproduction waveform Si at each split point (each interpolation point) Pt between adjacent sampling points Ps as interpolation data.

The data that is output from the interpolation filter 91 and that includes the interpolation data at each interpolation point Pt is equalized by the PR equalization circuit 92 including an FIR filter. Then, a phase error of the output data of the PR equalization circuit 92 is detected by the phase detection circuit 93. The detection result is filtered by the LPF 94, and captured into the controller 95.

The controller 95 updates interpolation timing in the interpolation filter 91 in accordance with the phase error of the output data of the PR equalization circuit 92. Accordingly, data at the original sampling timing is reproduced as output data of the PR equalization circuit 92, that is, as output data Do of the ITR section 90.

In the ITR data reproducing apparatus, since timing recovery can be realized only by digital processing in the ITR section 90 and the PLL is not formed by both an analog section and a digital section, the system can be configured simply. In addition, since a VCO is not used as the oscillator 82 for generating a sampling clock CLs, a stable operation can be expected.

More specifically, as a method for calculating and updating sampling timing (interpolation timing) in the controller 95, a method called an NCO (Number Controlled Oscillator) is shown in document 2 mentioned above.

In this method, in order to cause sampling timing to fit within timing defined within a sampling period Ts, updated sampling timing is subjected to integer division for the sampling period Ts, and the remainder of the division is used as sampling timing for determining a tap coefficient of the interpolation filter 91.

In addition, as an interpolation method in the interpolation filter 91, a method for obtaining an interpolation coefficient by calculating interpolation coefficients at all the timing in accordance with a sinc function in advance by using a sinc function as an interpolation function, by writing the interpolation coefficients as table values in a memory table, and by reading a corresponding table value from the memory table in accordance with interpolation timing data supplied from the interpolation filter 91 is shown in document 2 mentioned above.

In addition, linear interpolation between two adjacent sampled values is shown in document 3 mentioned above. In addition, linear approximation between two consecutive sampled values is shown in Japanese Patent No. 3255179 (document 4) (paragraph 0020 and FIG. 13).

The above-described known data reproducing method based on ITR, however, has the problems described below.

First, there is a problem with a method for calculating and updating sampling timing (interpolation timing). According to the division method shown in document 2, there is a problem not only in that the configuration of the ITR section 90 is complicated because many registers are necessary in terms of hardware but also in that the response of timing recovery is delayed because performing division reduces the processing speed.

Second, there is a problem with an interpolation method in the interpolation filter 91. If the method, which is shown in document 2, for obtaining an interpolation coefficient by writing interpolation coefficients at all the timing as table values in a memory table and by reading a corresponding table value from the memory table in accordance with interpolation timing data supplied from the controller 95 is used, an excellent reproduction output waveform with less distortion can be acquired.

In this method, however, since many table values must be prepared in a memory table, a large memory capacity is required. Thus, if the ITR section 90 is configured as an IC (integrated circuit), the chip size is increased.

In contrast, according to the methods, which are shown in documents 3 and 4, for performing linear interpolation between adjacent two sampled values, the configuration of the ITR section 90 can be simplified.

In the methods, however, since linear approximation between two sampled values is performed, there is a problem in that distortion occurs in a reproduction output waveform due to aliasing.

Thus, first, the present invention is capable of calculating and updating sampling timing at high speed with a simple configuration when data are reproduced based on ITR.

In addition, second, the present invention is capable of achieving an excellent reproduction output waveform with less distortion with a simple configuration when data are reproduced based on ITR.

DISCLOSURE OF INVENTION

An ITR data reproducing apparatus according to a first invention that reproduces a data value at an original data identification point by capturing input sampling data into an interpolation filter and by performing interpolation including a convolution operation on the input sampling data and a tap coefficient of the interpolation filter is characterized in that, in order to cause sampling timing for determining the tap coefficient to fit within timing defined within a data sampling interval, only a binary integer representation part is extracted, instead of actually performing a division operation, as a quotient obtained by performing integer division of updated sampling timing with a data sampling interval, and only the input sampling data for a number of the binary integer representation part is captured into the interpolation filter to operate a pipeline.

An ITR data reproducing apparatus according to a second invention that reproduces a data value at an original data identification point by capturing input sampling data into an interpolation filter and by performing interpolation including a convolution operation on the input sampling data and a tap coefficient of the interpolation filter is characterized in that the interpolation filter splits a data sampling interval of an interpolation function into N, which represents an integer of two or more, and calculates interpolation data by performing linear interpolation for each of the split periods.

In the ITR data reproducing apparatus according to the first invention configured as described above, since calculation and update of sampling timing is performed without performing integer division, calculation and update of the sampling timing can be performed at high speed with a simple configuration.

In the ITR data reproducing apparatus according to the second invention configured as described above, with a configuration that is significantly simpler than a case where a tap coefficient is calculated directly from an interpolation function, an excellent reproduction output waveform with less distortion can be acquired as in the case where the tap coefficient is calculated directly from the interpolation function.

As described above, according to the first invention, when data are reproduced using ITR, calculation and update of sampling timing can be performed at high speed with a simple configuration.

In addition, according to the second invention, when data are reproduced using ITR, an excellent reproduction output waveform with less distortion can be acquired with a simple configuration.

BRIEF DESCRIPTION OF THE DRAWINGS

FIG. 5 shows an example of a table for the interpolation filter.

FIG. 7 shows another example of the table for the interpolation filter.

FIG. 8 shows another example of the table for the interpolation filter.

BEST MODE FOR CARRYING OUT THE INVENTION

Figure 1:
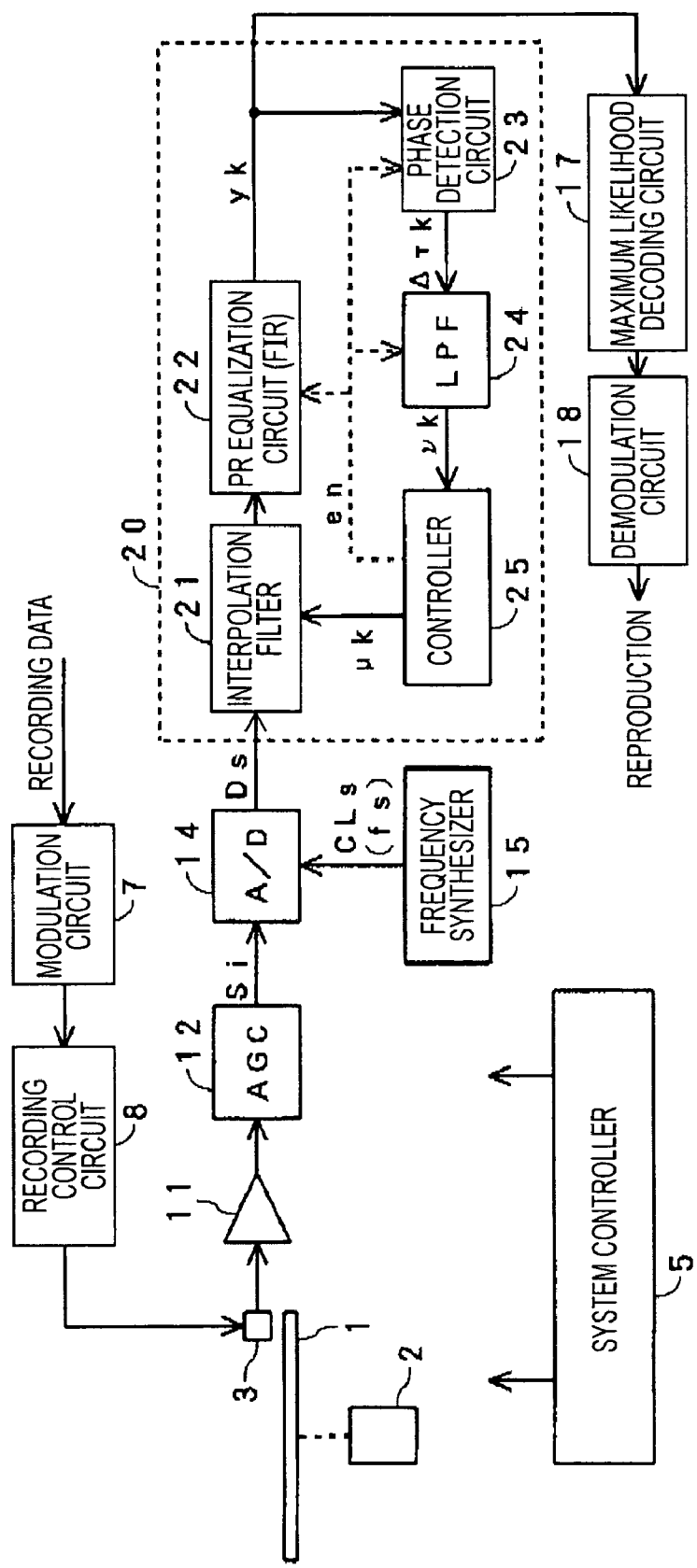
FIG. 1 shows an example of a recording/reproducing system including an ITR data reproducing apparatus according to the present invention.

[Example of Recording/Reproducing System and Outline of ITR Data Reproducing Apparatus: FIG. 1]

FIG. 1 shows an example of a recording/reproducing system provided with an ITR data reproducing apparatus according to the present invention.

In this example, a recording medium 1 is a magnetic disc or an optical disc, and it is driven and rotated by a rotary drive source 2. A recording/reproducing head 3 is a magnetic head when the recording medium 1 is a magnetic disc or an optical head (optical pickup) when the recording medium 1 is an optical disc.

Driving of the rotary drive source 2, movement of the recording/reproducing head 3, and each unit of the system are controlled by a system controller 5.

When recording is performed, compressed digital data compressed by various compression technologies or non-compressed digital data are acquired as recording data, and the recording data are converted into a code suitable for recording/reproduction by a modulation circuit 7.

When the recording/reproducing head 3 is a magnetic head, the modulated recording signal is converted into a recording current by a recording control circuit 8. When the recording/reproducing head 3 is an optical head, the modulated recording signal is converted into a recording laser beam by the recording control circuit 8. Accordingly, recording data is recorded on the recording medium 1.

When reproduction is performed, a signal recorded on the recording medium 1 is read by the recording/reproducing head 3 from the recording medium 1, and the reproduction signal is acquired as an analog reproduction waveform Si through a reproducing amplifier (RF amplifier) 11 and an AGC (Automatic Gain Control) circuit 12.

In addition, in an A/D converter circuit 14, the reproduction waveform Si is sampled in accordance with a sampling clock CLs supplied from a frequency synthesizer 15, and the sampled value is converted into sampling data Ds. The frequency synthesizer 15 generates a clock at a fixed frequency fs determined in advance as a sampling clock CLs.

In this example, oversampling in which the sampling rate fs is higher than the original data rate fi included in the reproduction waveform Si is performed.

The sampling data Ds output from the A/D converter circuit 14 is supplied to an ITR section 20. The ITR section 20 forms a digital PLL by an interpolation filter 21, a PR equalization circuit 22, a phase detection circuit 23, an LPF 24, and a controller 25.

The interpolation filter 21 outputs the value of the reproduction waveform Si, as interpolation data, at each interpolation point between sampling points at which sampled values are acquired as sampling data Ds by a special interpolation method, which will be described below, in accordance with sampling timing μk, which is a value for phasing supplied from the controller 25.

The output data including the interpolation data at each interpolation point, which is output from the interpolation filter 21, is equalized by the PR equalization circuit 22 including an FIR filter. Then, a phase error of output data yk of the PR equalization circuit 22 is detected by the phase detection circuit 23. The detection result Δτk is filtered by the LPF 24 and captured into the controller 25.

The controller 25 updates the sampling timing μk in the interpolation filter 21 in accordance with the phase error Δτk of the output data yk of the PR equalization circuit 22. Accordingly, a data at the original sampling timing is reproduced as the output data yk of the PR equalization circuit 22, that is, as output data of the ITR section 20.

The PR equalization circuit 22, the phase detection circuit 23, and the LPF 24 are controlled, in accordance with an enable signal en supplied from the controller 25, to operate when the enable signal en is 1 (high level) and to stop the operation when the enable signal en is 0 (low level).

The output data of the ITR section 20 is maximum-likelihood decoded by a maximum-likelihood decoding circuit 17. The data after decoding is demodulated by a demodulation circuit 18 in accordance with a modulation method used in the modulation circuit 7 of a recording system. Accordingly, a reproduction data is acquired from the demodulation circuit 18.

[Data Reproduction Method in ITR Section 20]

(Interpolation method in Interpolation Filter 21: FIGS. 2 to 8]

As an interpolation method in the interpolation filter 21, for an interpolation function, each sampling period Ts of input sampling data Ds is split into a plurality of periods, each split period is interpolated based on a linear function, and a data (a function value) at each interpolation point within the split period is calculated. Hereinafter, interpolation in this method is referred to as split linear interpolation.

Basically, the number N of splits of a sampling period Ts may be plural (an integer of two or more). However, in terms of simplification of a circuit configuration and processing, it is preferable that the following condition be satisfied:

$$N=2^M \quad (1),$$

where M is an integer of 1 or more.

In addition, the lengths of split periods (interpolation periods) are not necessarily equal to each other. However, it is preferable that the lengths of the split periods (interpolation periods) be equal to each other in terms of simplification of a circuit configuration and processing.

Figure 2:
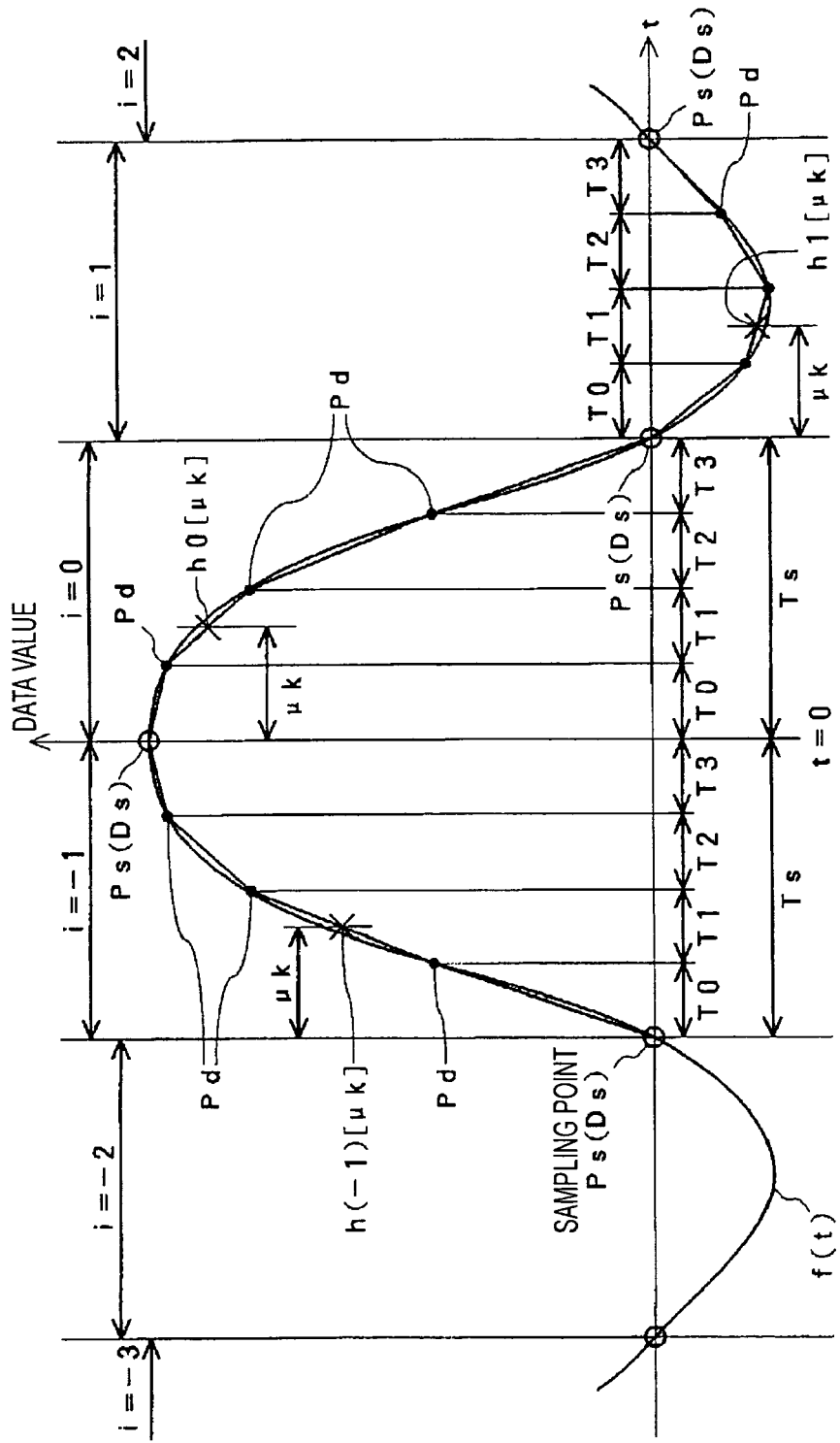
FIG. 2 is an illustration for explaining split linear interpolation according to the present invention.

FIG. 2 shows a case where M is 2 and N is 4. In this example, each sampling period Ts is split by split nodes (although the split nodes are represented by black circles, sampling points Ps represented by white circles also function as split nodes) Pd into four interpolation periods T0, T1, T2, and T3 whose lengths are equal to each other. In each of the interpolation periods T0 to T3, sixteen interpolation points (interpolation timing) including split nodes Pd are set. Thus, sixty-four interpolation points (interpolation timing) are set for a sampling period Ts.

For each of the split nodes Pd, a function value is calculated in advance based on an interpolation function f(t) and is written as a table value in a table. For each of the interpolation points other than the split nodes Pd, a data value (function value) is calculated in accordance with an interpolation operation based on linear interpolation using table values of the previous and subsequent split nodes Pd. In this embodiment, a linear interpolation portion that performs such linear interpolation is included in a tap coefficient calculation unit 215.

More specifically, when sampling timing μk calculated by the controller 25 and supplied to the interpolation filter 21 is represented by a real number defined by the condition 0≦μk<1, a value v, which satisfies the following condition:

$$v/N \leq \mu k < (v+1)/N \quad (2),$$

is detected from the sampling timing μk as an integer defined by the condition 0≦v<N (when N is 4, v=0, 1, 2, 3), and the i-th tap coefficient of the interpolation filter 21 is represented by hi[μk], the following calculation is performed:

$$hi[\mu k]=(v+1-N\cdot\mu k)\cdot f((i+v/N)\cdot Ts)-(v-n\cdot\mu k)\cdot f((i+(v+1)/N)\cdot Ts) \quad (3).$$

Here, f((i+v/N)·Ts) and ((i+(v+1)/N)·Ts) are table values of the split nodes Pd previous and subsequent to an interpolation point.

When N is 4, as shown in FIG. 2, if sampling timing μk is represented in six-bit binary with a resolution of sixty-four levels, 000000-001111 belongs to the interpolation period T0 (v=0), 010000-011111 belongs to the interpolation period T1 (v=1), 100000-101111 belongs to the interpolation period T2 (v=2), and 110000-111111 belongs to the interpolation period T3 (v=3).

In other words, in this example, it is determined whether an interpolation point (interpolation timing) belongs to the interpolation period T0, T1, T2, or T3 in accordance with the higher two bits of the six-bit sampling timing μk. If the higher two bits are 00, linear interpolation can be performed for the interpolation period T0. If the higher two bits are 01, linear interpolation can be performed for the interpolation period T1. If the higher two bits are 10, linear interpolation can be performed for the interpolation period T2. If the higher two bits are 11, linear interpolation can be performed for the interpolation period T3.

However, since the sampling timing μk has a resolution for splitting a sampling period Ts into sixty-four periods, actually, the sampling timing μk is a six-bit binary fraction represented by the condition $0 \leq \mu k < 1$.

Figure 3:
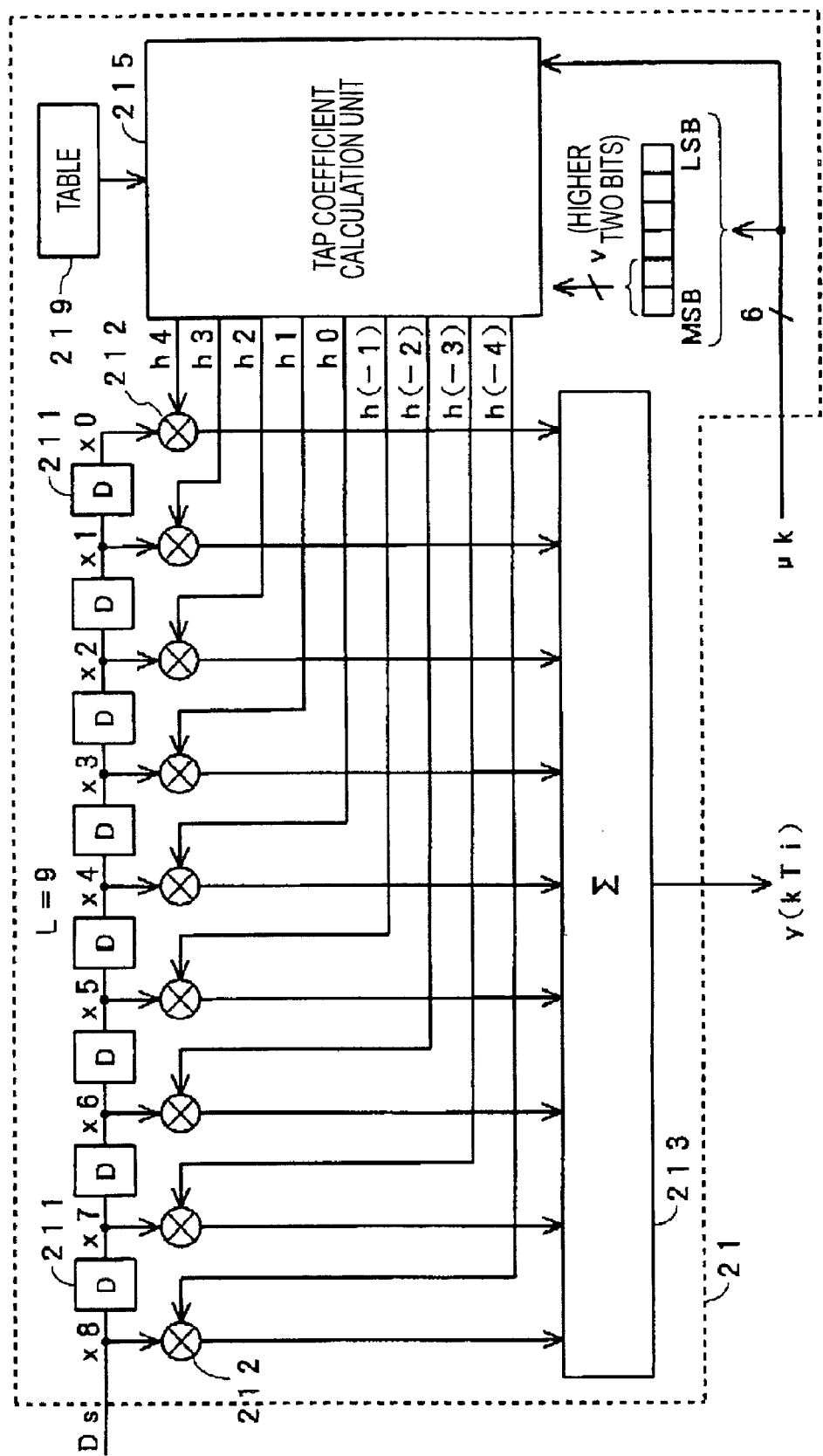
FIG. 3 shows an example of an interpolation filter of an ITR section.

FIG. 3 shows an example of the interpolation filter 21 that performs the split linear interpolation described above. This example shows a case where the number L of taps is nine and a tap index number i is represented by {−4, −3, −2, −1, 0, 1, 2, 3, 4}.

A delay circuit 211 in each stage delays input data by a time of a sampling period Ts in accordance with the sampling clock CLs mentioned above. The delay circuits described below operate similarly.

Sampling timing μk is split into the whole six bits and higher two bits representing an integer v (0, 1, 2, 3). The split sampling timing μk is supplied to the tap coefficient calculation unit 215. The tap coefficient calculation unit 215 calculates a tap coefficient hi[μk], as described below.

Multiplier circuits 212 multiply input sampling data Ds or output data of the delay circuits 211 by respective tap coefficients h(−4) to h4 supplied from the tap coefficient calculation unit 215. The respective multiplication results are added in an adder circuit 213. Accordingly, output data y(kTi) obtained by synchronizing the phase timing of the sampling data Ds input to the interpolation filter 21 can be acquired from the adder circuit 213.

The tap coefficient calculation unit 215 includes nine tap coefficient calculation circuits having the same configuration for cases where i is −4, −3, −2, −1, 0, 1, 2, 3, and 4.

Figure 4:
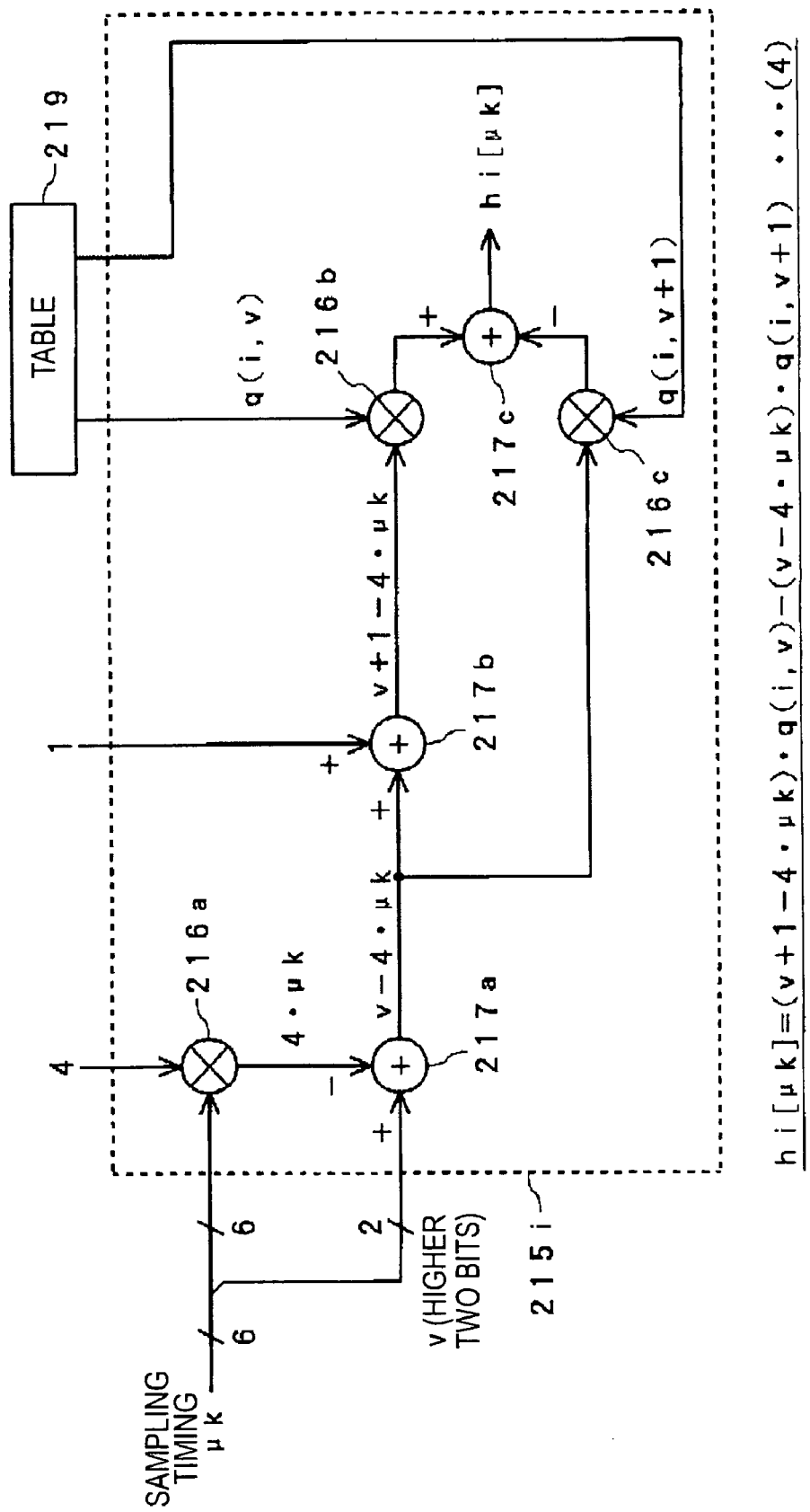
FIG. 4 shows an example of a tap coefficient calculation circuit of the interpolation filter.

FIG. 4 shows an example of one of the tap coefficient calculation circuits. Condition (3) mentioned above is represented by the following condition:

$$hi[\mu k] = (v+1-4 \cdot \mu k) \cdot q(i,v) - (v-4 \cdot \mu k) \cdot q(i,v+1) \quad (4),$$

where N is 4.

Here, q(i,v) and q(i,v+1) are table values of the split nodes Pd previous and subsequent to an interpolation point and are represented by the following conditions:

$$q(i,v) = f((i+v/4) \cdot Ts) \quad (5)$$

$$q(i,v+1) = f((i+(v+1)/4) \cdot Ts) \quad (6).$$

In a tap coefficient calculation circuit 215i shown in FIG. 4, a multiplier circuit 216a multiplies a binary fraction of sampling timing μk by 4, and a subtracter circuit 217a subtracts a multiplication result of the multiplier circuit 216a from an integer v represented by the higher two bits of the sampling timing μk. An adder circuit 217b adds 1 to the subtraction result of the subtracter circuit 217a, and a multiplier circuit 216b multiplies a table value q(i,v) read from a table 219 by the addition result of the adder circuit 217b. A multiplier circuit 216c multiplies a table value q(i,v+1) read from the table 219 by the subtraction result of the subtracter circuit 217a, and a subtracter circuit 217c subtracts the multiplication result of the multiplier circuit 216c from the multiplication result of the multiplier circuit 216b. Accordingly, a tap coefficient represented by condition (4) is calculated as output data of the subtracter circuit 217c.

FIG. 5 shows an example of the table 219 when a sinc function is used as an interpolation function f(t). Here, the sinc function is represented by the condition sinc(t)=sin(t)/t. This is represented by grouping in accordance with a tap index number i. For example, when i is 0 and v is 0, a table value q(0,0) corresponds to 1. When i is 0 and v is 1, a table value q(0,1) corresponds to 0.900316.

As is clear from FIG. 2, since a table value q(0,4) when i is 0 and v is 4 is equal to a table value q(1,0) when i is 1 and v is 0, the table values are described correspondingly. Similarly, a table value q(1,4) is equal to a table value q(2,0), a table value q(2,4) is equal to a table value q(3,0), and a table value q(3,4) is equal to a table value q(4,0).

Thus, when i is 0, 1, 2, or 3, four table values are required. When i is 4, five table values are required.

In addition, the sinc function is a function that is axisymmetrical with respect to a time represented by t=0. When i is smaller than 0, the following condition is satisfied:

$$q(i,v) = q(|i|-1, 4-v) \quad (7).$$

Thus, when i is smaller than 0, a unique table value is not necessary. When i is smaller than 0, q(|i|−1,4−v) can be used as a table value q(i,v). For example, as a table value q(−1,3) when i is −1 and v is 3, q(0,1) can be referred to.

Thus, in this example, only twenty-one table values need to be stored in the table 219. Therefore, the necessary capacity of the memory table can be extremely reduced.

As an interpolation function f(t), any function can be used instead of the sinc function. An example of a case where a "Cubic Interpolator" or a "Piecewise-Parabolic Interpolator" shown in document 3 mentioned above is used as an interpolation function f(t) will be shown. Each of the "Cubic Interpolator" and the "Piecewise-Parabolic Interpolator" uses a polynomial function.

Figure 6:
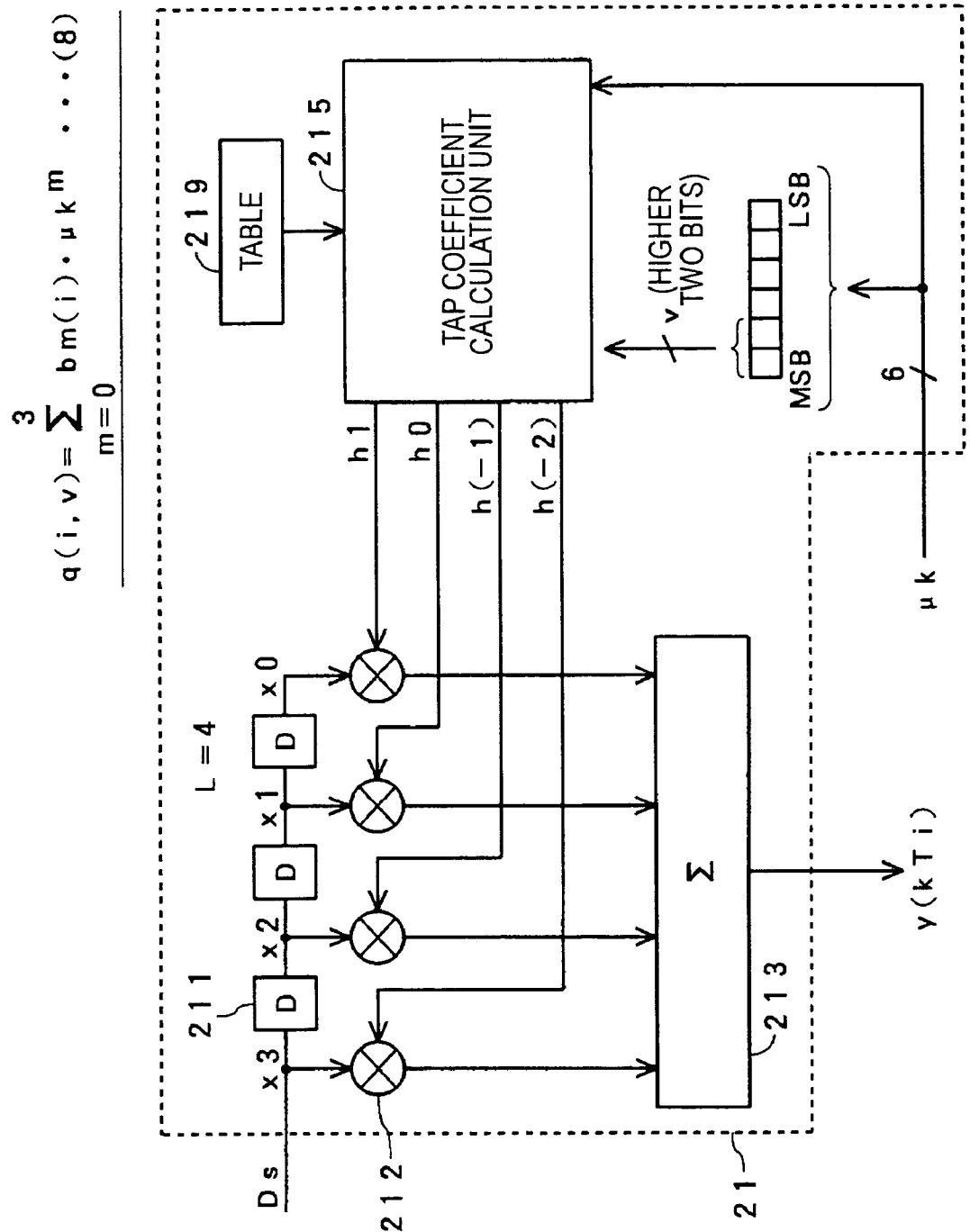
FIG. 6 shows another example of the interpolation filter of the ITR section.

FIG. 6 shows an example of the interpolation filter 21 when the number L of taps is four and the number N of splits is four. This example is equal to the example shown in FIG. 3 with the exception that the number of the delay circuits 211 is three, the number of the multiplier circuits 212 is four, and the tap coefficient calculation unit 215 includes four tap coefficient calculation circuits for cases where i is −2, −1, 0, and 1.

When the "Cubic Interpolator" or the "Piecewise-Parabolic Interpolator" mentioned above is used, a function value q(i,v) of a split node is calculated, as shown in FIG. 6, based on the following condition:

$$q(i,v) = (m=0 \text{ to } 3) \Sigma bm(i) \cdot \mu km \quad (8),$$

and the obtained function value q(i,v) is written as a table value in the table 219. When a tap coefficient is calculated, the function value q(i,v) is read from the table 219. Here, bm(i) is the content of TABLE 1 and TABLE 2 described in page 1,001 of document 3 and means that a table to be referred to is different depending on the function. In addition, i represents a tap index number.

FIG. 7 shows an example of the table 219 when the "Cubic Interpolator" is used. In this example, since condition (7) mentioned above is satisfied when i is smaller than 0, nine table values can be prepared.

FIG. 8 shows an example of the table 219 when the "Piecewise-Parabolic Interpolator" is used. This example shows a case where an example when α is 0.5 in TABLE 2 described in document 3 is used. In this example, since condition (7) mentioned above is satisfied when i is smaller than 0, nine table values can be prepared.

Figure 9:
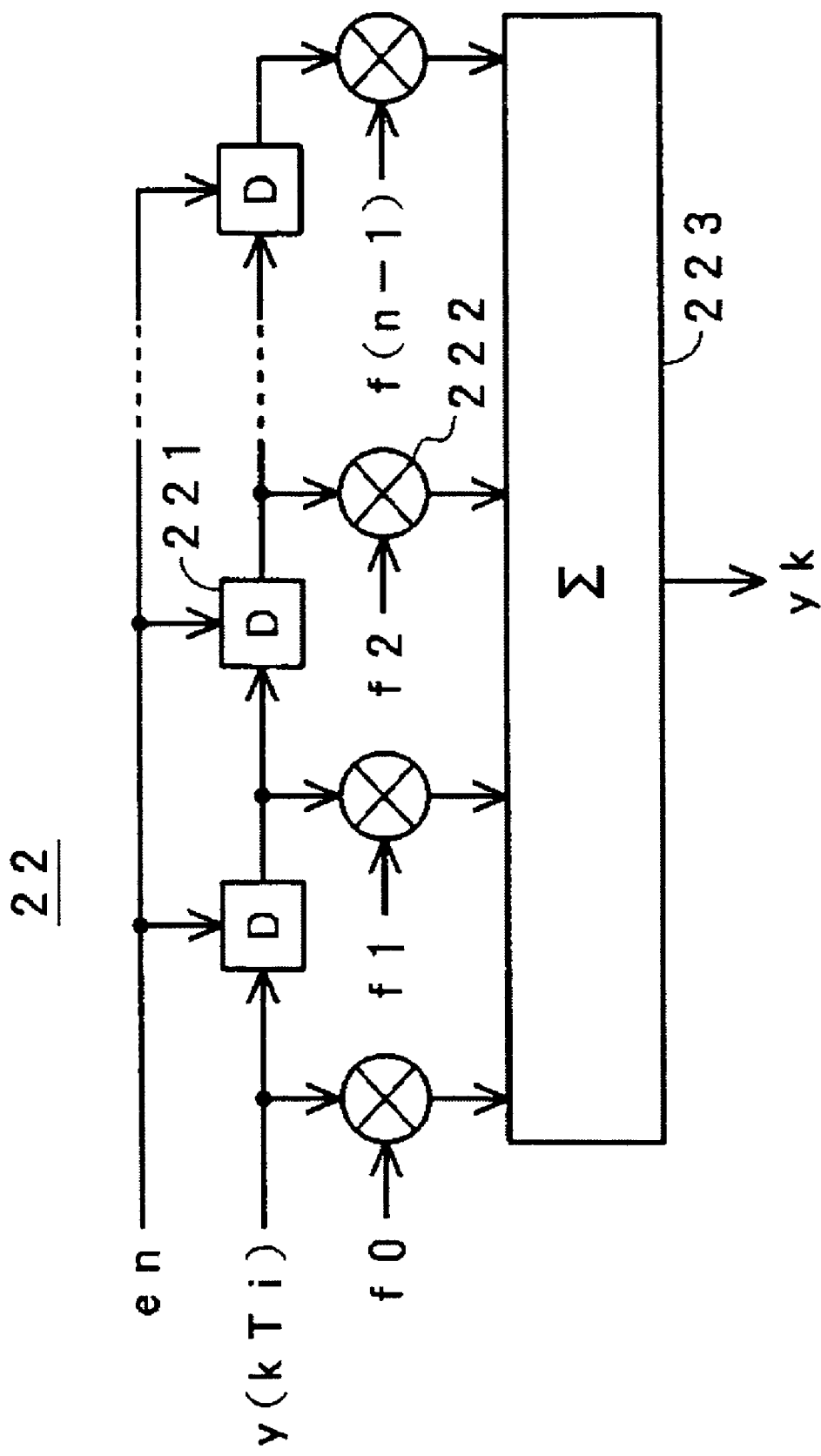
FIG. 9 shows an example of a PR equalization circuit of the ITR section.
Figure 10:
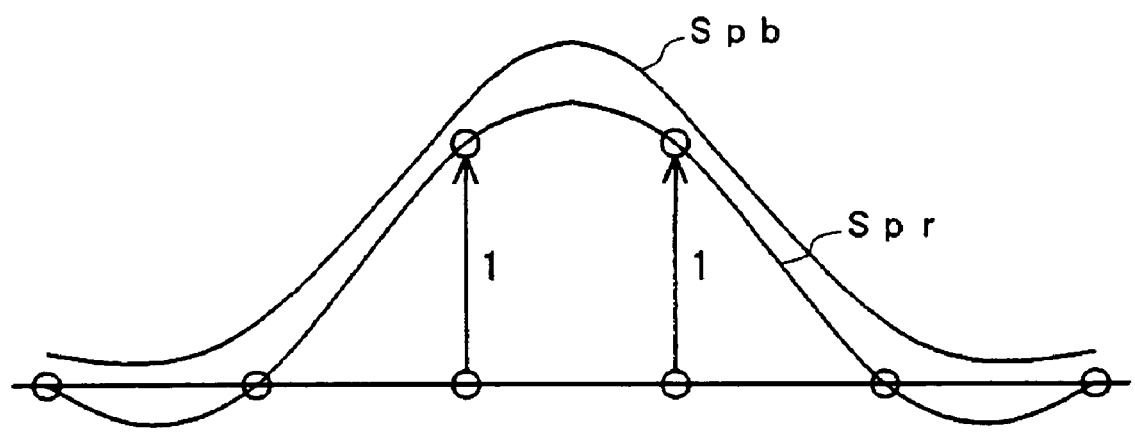
FIG. 10 is an illustration for explaining PR equalization.
Figure 11:
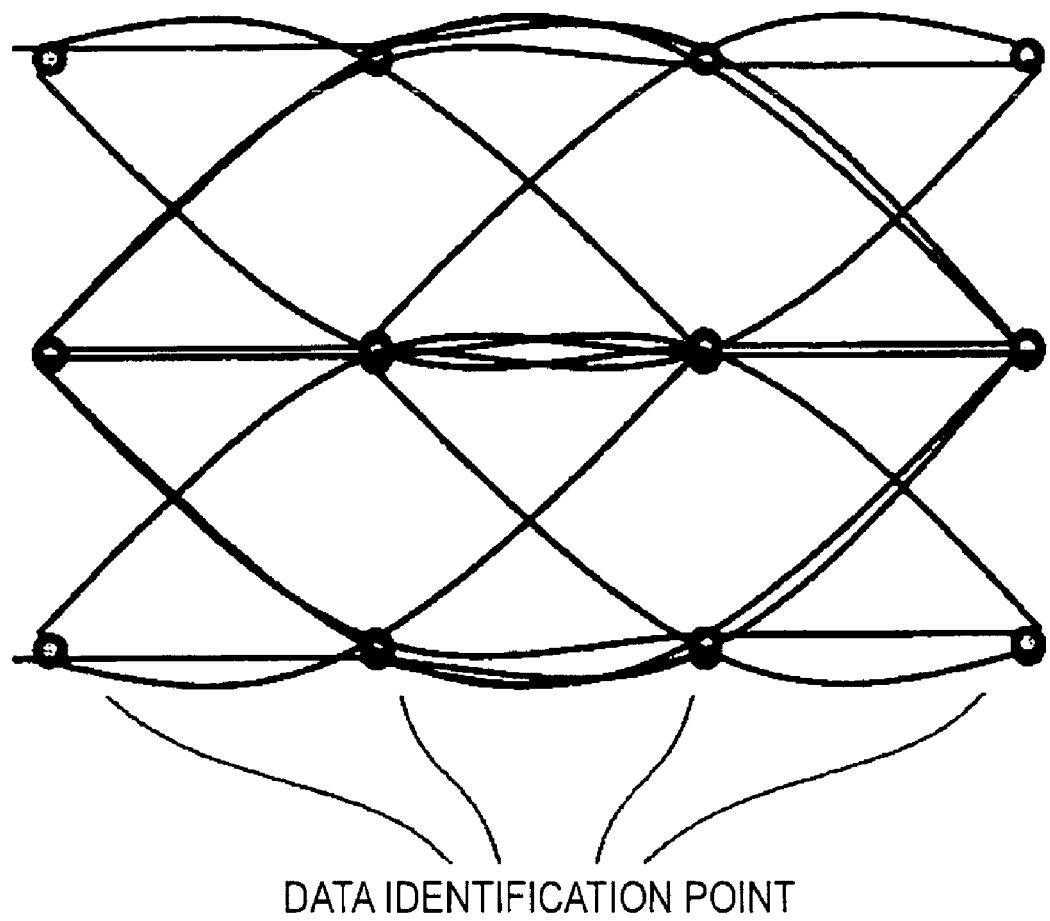
FIG. 11 shows an eye pattern.

(Configuration and Operation of PR Equalization Circuit 22: FIGS. 9 to 11)

FIG. 9 shows an example of the PR equalization circuit 22 shown in FIG. 1. The PR equalization circuit 22 is formed by a FIR filter including delay circuits 221, multiplier circuits 222, and an adder circuit 223. In the PR equalization circuit 22, for example, n tap coefficients, f0, f1, . . . , and f(n−1) for changing a reproduction waveform impulse response represented by a waveform Spb into a PR waveform represented by Spr, as in FIG. 10, are set. The PR equalization circuit 22 performs PR(1,1) waveform equalization.

Each of the delay circuits 221 has an enable function. When an enable signal en supplied from the controller 25 is 1, each of the delay circuits 221 captures and holds input data in accordance with a sampling clock CLs. When an enable signal en supplied from the controller 25 is 0, each of the delay circuits 221 does not capture input data. The delay circuits having an enable function described below also operates similarly.

An actual equalization waveform by PR(1,1) is represented by convolution of various binary recording data {−1, +1} and a PR waveform represented by the waveform Spr shown in FIG. 10. Thus, the actual PR(1,1) equalization waveform is shaped in an eye pattern as shown in FIG. 11, and a data identification point has ternary data.

Figure 12:
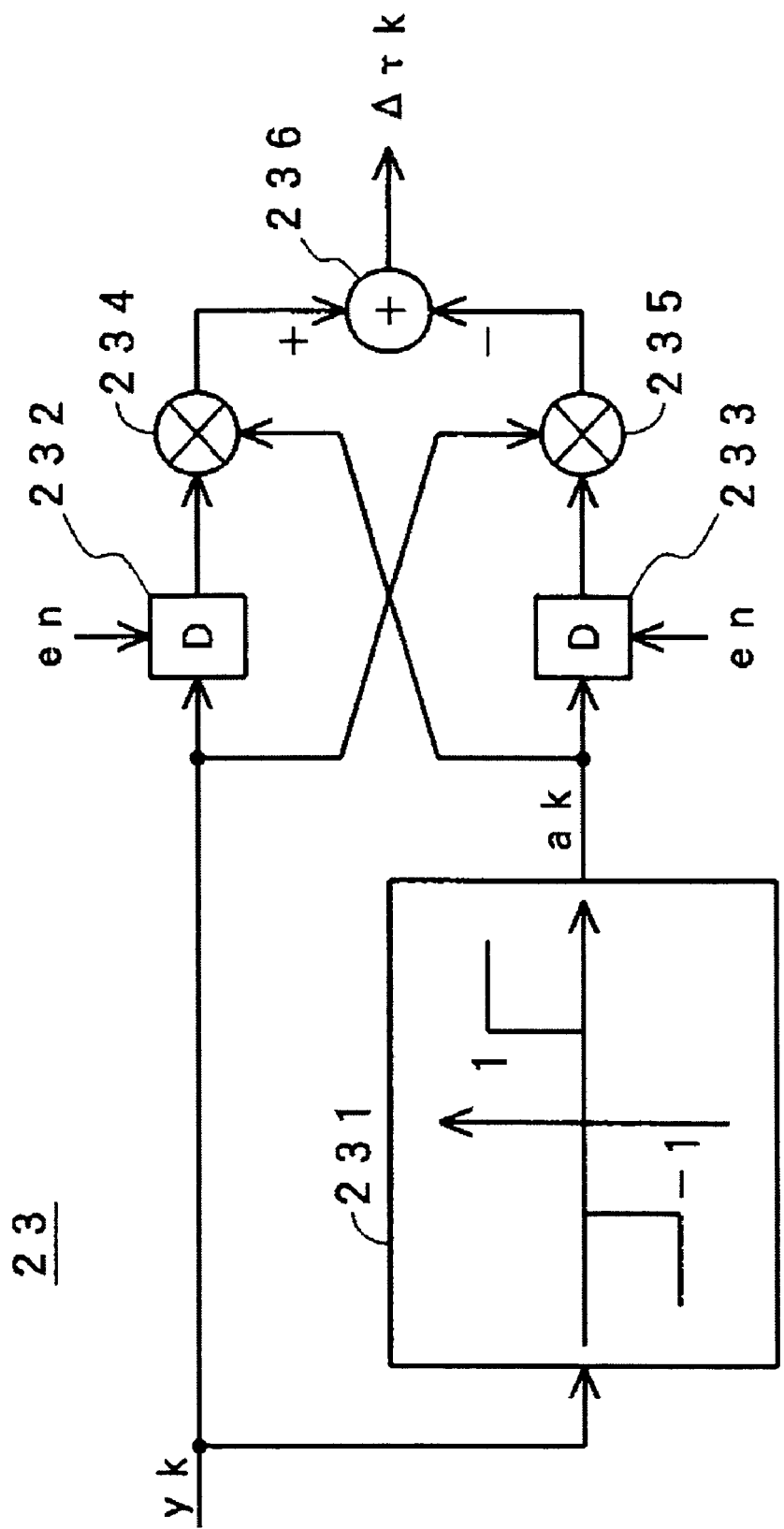
FIG. 12 shows an example of a phase detection circuit of the ITR section.

(Configuration and Operation of Phase Detection Circuit 23: FIG. 12)

The phase detection circuit 23 shown in FIG. 1 detects a sampling phase represented by the condition:

$$\Delta\tau k = -yk \cdot a(k-1) + y(k-1) \cdot ak \quad (9),$$

which can be stochastically obtained from a PR equalization waveform and a tentatively determined value, as shown in document 1 mentioned above and the like.

However, yk represents PR(1,1) an equalization waveform data at time k, which is output from the PR equalization circuit 22, and ak represents a tentatively determined value of a detection result of three values {−1, 0, +1} of the data yk. In addition, (k−1) represents a point in time which is a sampling period Ts before the time k.

FIG. 12 shows an example of the phase detection circuit 23. In the phase detection circuit 23, a ternary detection circuit 231 performs ternary detection for input data yk to acquire a tentatively determined value ak. Then, delay circuits 232 and 233 that have an enable function delay the input data yk and the tentatively determined value ak, respectively, by a sampling period Ts. Then, a multiplier circuit 234 multiplies the tentatively determined value ak by output data of the delay circuit 232, and a multiplier circuit 235 multiplies the input data yk by output data of the delay circuit 233. Then, a subtracter circuit 236 subtracts output data of the multiplier circuit 235 from output data of the multiplier circuit 234. Accordingly, a sampling phase Δτk represented by condition (9) is calculated as output data of the subtracter circuit 236.

Figure 13:
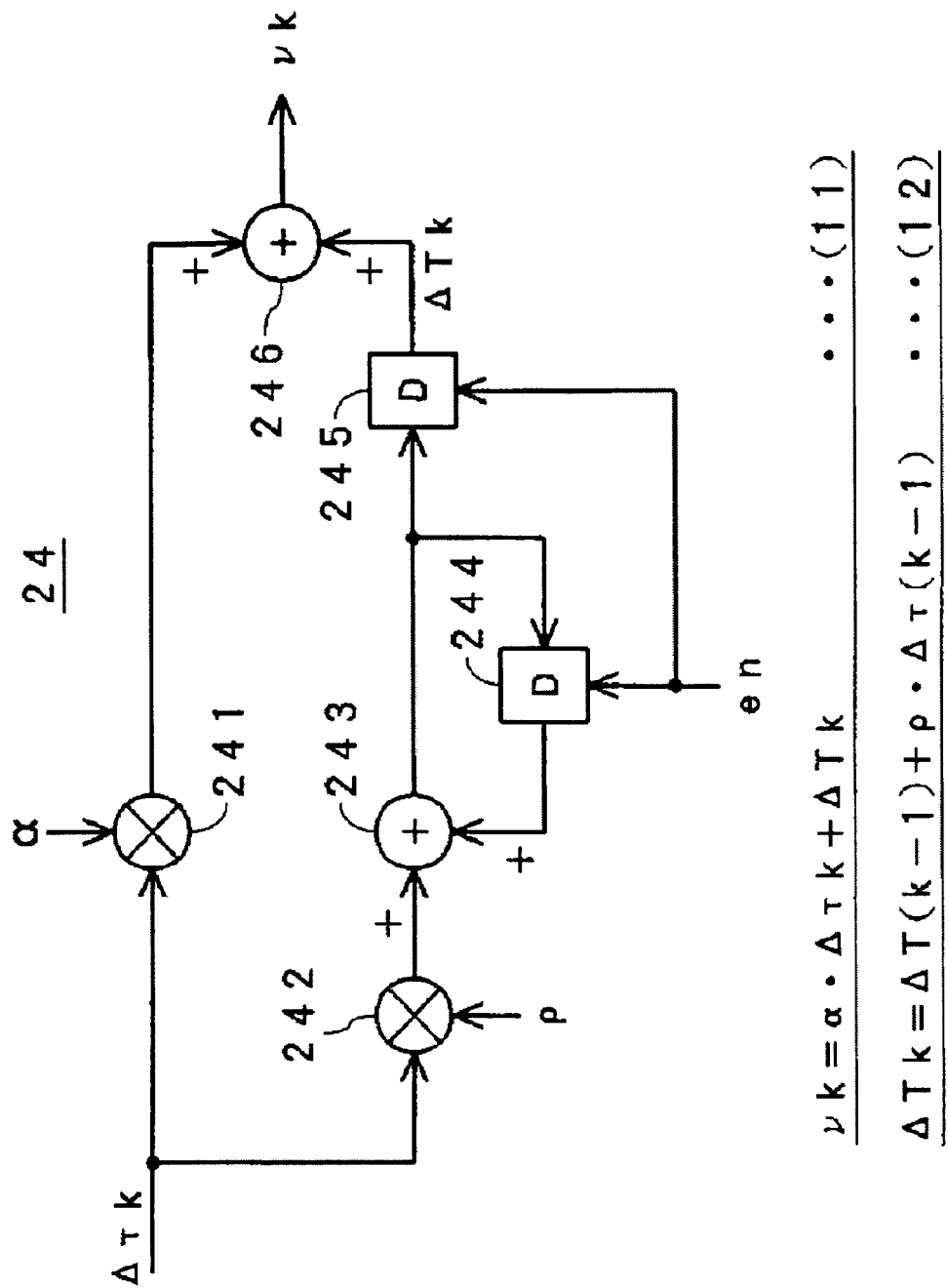
FIG. 13 shows an example of an LPF of the ITR section.

(Configuration and Operation of LPF 24: FIG. 13)

The LPF 24 shown in FIG. 1 includes a secondary control loop in terms of control engineering, as shown in document 1 mentioned above and the like. The LPF 24 calculates a timing difference vk for updating sampling timing μk in accordance with the sampling phase Δτk mentioned above.

The timing difference vk is represented as follows:

$$vk = \alpha \cdot \Delta\tau k + \Delta Tk \quad (11)$$

$$\Delta Tk = \Delta T(k-1) + \rho \cdot \Delta\tau(k-1) \quad (12),$$

where α and ρ represent coefficients.

FIG. 13 shows an example of the LPF 24. In the LPF 24, multiplier circuits 241 and 242 multiply the input data Δτk by α and ρ, respectively. Output data of the multiplier circuit 242 pass through an adder circuit 243 and are delayed by a sampling period Ts by a delay circuit 244 having an enable function. Then, the adder circuit 243 adds output data of the multiplier circuit 242 and output data of the delay circuit 244. A delay circuit 245 having an enable function delays output data of the adder circuit 243 by a sampling period Ts. An adder circuit 246 adds output data of the multiplier circuit 241 and output data of the delay circuit 245. Accordingly, a timing difference vk, which is represented by conditions (11) and (12), is calculated as output data of the adder circuit 246.

Figure 14:
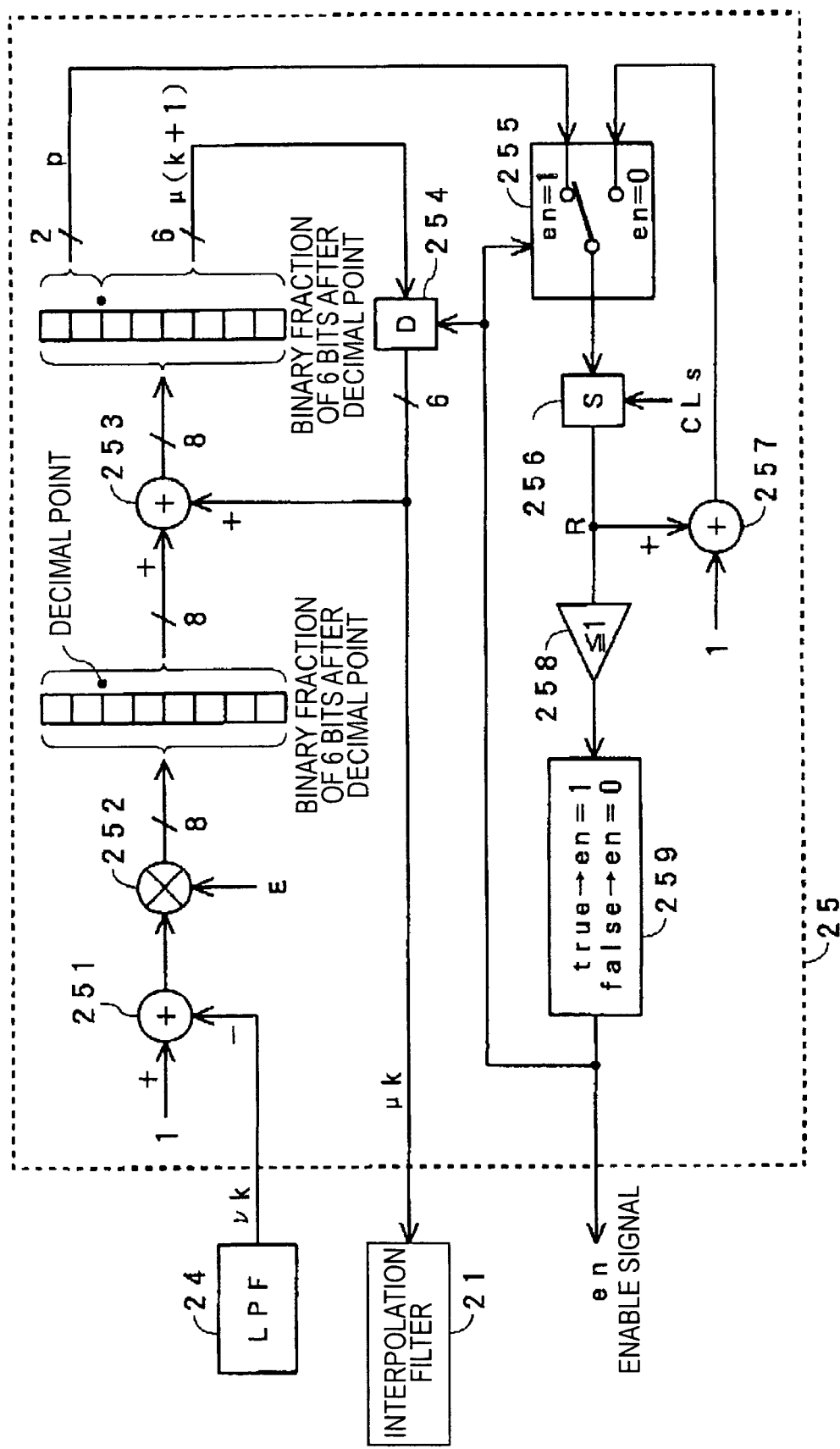
FIG. 14 shows an example of a controller of the ITR section.

(Configuration and Operation of Controller 25: FIG. 14)

The controller 25 shown in FIG. 1 controls an interpolation operation of the interpolation filter 21. At the same time, the controller 25 controls operations of the PR equalization circuit 22, the phase detection circuit 23, and the LPF 24 in accordance with an enable signal en.

Sampling timing μk supplied from the controller 25 to the interpolation filter 21 is defined by the condition 0≦μk<1 so that a center tap of the interpolation filter 21 does not shift over sampling periods Ts (so that the shift occurs within a sampling period Ts).

Update of the sampling timing μk is performed based on a calculation represented by the following condition:

$$\mu(k+1) = [\mu k + \epsilon(1-vk)] \bmod -1 \quad (13),$$

where μ(k+1) represents sampling timing after update. Here, "mod−1" represents a remainder operation with an integer of 1.

When the original data period included in a reproduction waveform Si (an inverse of the original data rate fi) is represented by Ti, ε represents an oversampling rate defined by the following condition:

$$\epsilon = Ti/Ts \quad (14).$$

For example, when the sampling rate fs (=1/Ts) in the A/D converter circuit 14 is 1.1 times as large as the original data rate fi (=1/Ti), ε is 1.1.

In addition, as in the following condition:

$$p = (int)([\mu k + \epsilon(1-vk)]) \quad (15),$$

a result obtained by integer division with 1 is represented by p.

In the example below, sampling timing μk is updated by extracting a fractional part of a binary fraction and an integer part and performing processing, instead of performing such a remainder operation and integer division.

FIG. 14 shows an example of the controller 25 that performs such an update of sampling timing μk. As described above, the sampling timing μk is represented by a six-bit binary fraction representing sampling timing based on a resolution of sixty-four levels.

In the controller 25 in this example, a subtracter circuit 251 subtracts the timing difference vk calculated by the LPF 24 from 1, and a multiplier circuit 252 multiplies the subtraction result by the oversampling rate ε represented by condition (14).

Although the multiplication result ε(1−vk) is represented using a binary fraction of six bits after the decimal point, data obtained by adding bits of an integer part to the fractional part is used as output data of the multiplier circuit 252. As an integer part, the number of bits that does not cause overflow in the system can be prepared. In this example, two bits are added as an integer part, and data having eight bits is used as output data of the multiplier circuit 252.

The eight-bit output of the multiplier circuit 252 is input as an eight-bit input to an adder circuit 253 for a six-bit input, an eight-bit input, and an eight-bit output. In addition, sampling timing $\mu k$ at the immediately previous time (before update) supplied from a delay circuit 254 having an enable function is input to the adder circuit 253 as a six-bit input.

Then, a fractional part formed by the lower six bits of the eight-bit output of the adder circuit 253 is extracted as sampling timing $\mu(k+1)$ after the update, and the sampling timing $\mu(k+1)$ is delayed by a sampling period Ts by the delay circuit 254.

In addition, an integer part formed by the higher two bits of the eight-bit output of the adder circuit 253 is extracted as a result p of the integer division mentioned above.

When an enable signal en is 1, the integer part p is captured into a register 256 via a switch 255 in accordance with a sampling clock CLs.

Then, a comparator 258 compares an output-value R of the register 256 with 1. If R is smaller than or equal to 1, a logic circuit 259 connected to the comparator 258 outputs an enable signal en of 1. If R is larger than 1, the logic circuit 259 outputs an enable signal en of 0.

If an enable signal en is 0, the operations of the PR equalization circuit 22, the phase detection circuit 23, and the LPF 24 stop, as described above. At the same time, in the controller 25, the switch 255 is switched to a side of a subtracter circuit 257. Instead of the integer part p at that time, a result of the subtracter circuit 257 obtained by subtracting 1 from the output value R of the register 256 is captured into the register 256.

Thus, for example, when $\epsilon$ is 1.1, as describe above, a decimation operation of sampling data Ds is performed for each eleven sampling operations of a reproduction waveform Si based on a sampling clock CLs, so that data of the original data rate fi is acquired as reproduction data.

As described above, in a sampling timing update method in this example, by extracting an integer part and a fractional part of a binary fraction and by performing processing, sampling timing $\mu k$ can be updated without directly performing integer division or a remainder operation. In addition, the sampling timing $\mu k$ can be updated at high speed with a simple configuration.

Figure 15:
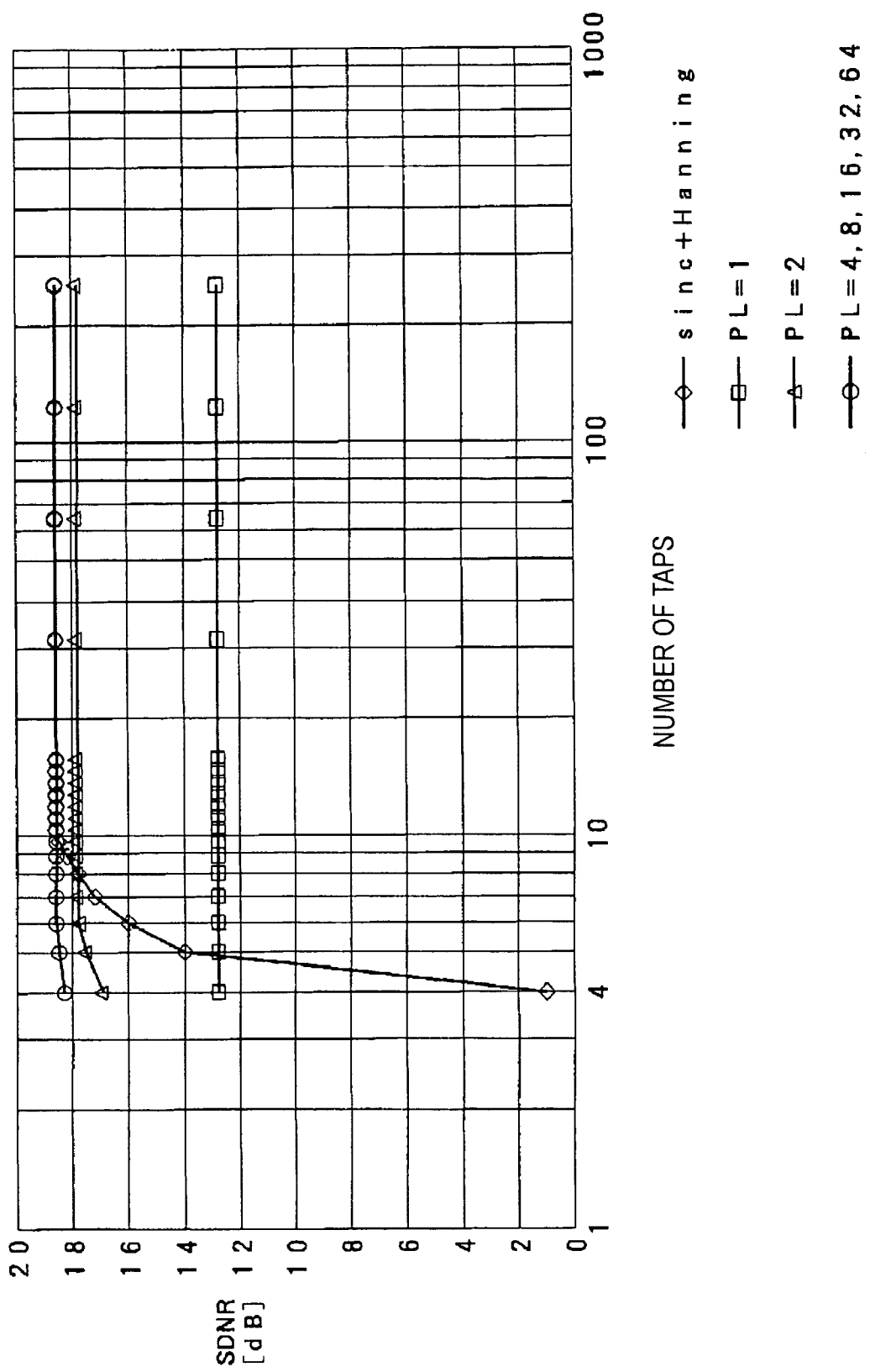
FIG. 15 shows a simulation result of an interpolation method.
Figure 16:
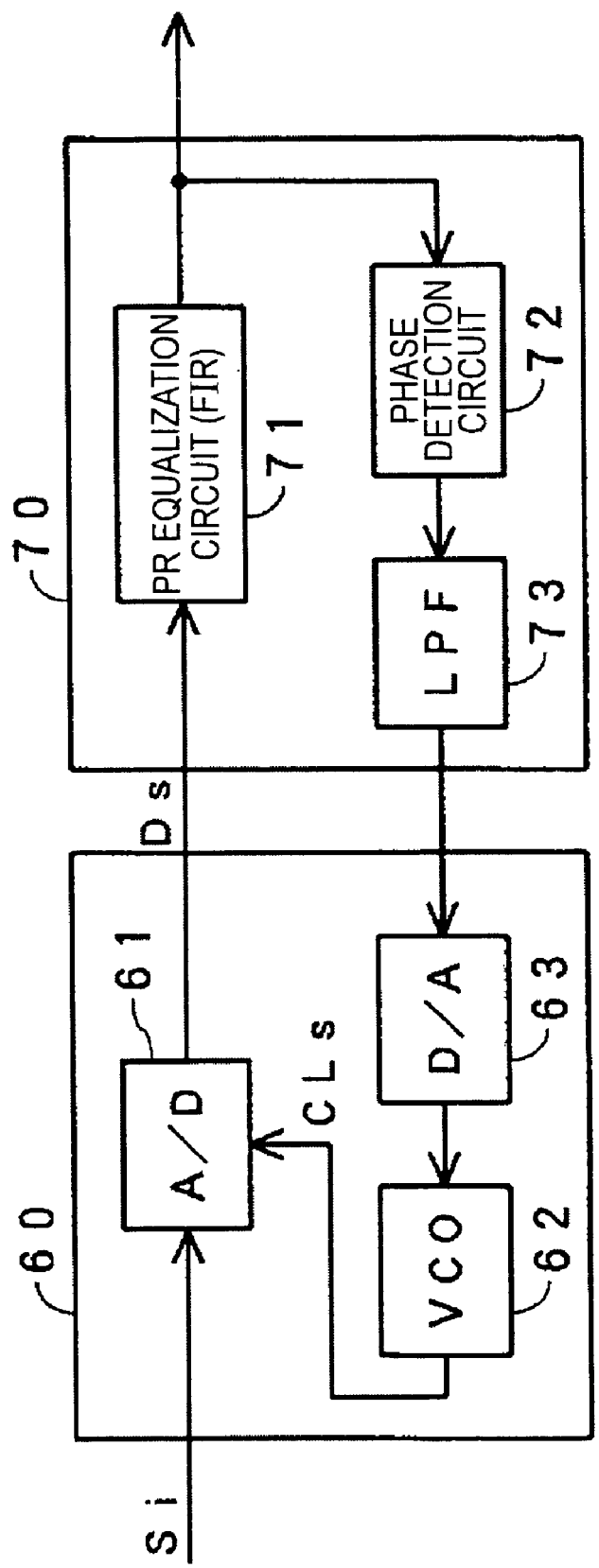
FIG. 16 shows a known PLL data reproducing apparatus.
Figure 17:
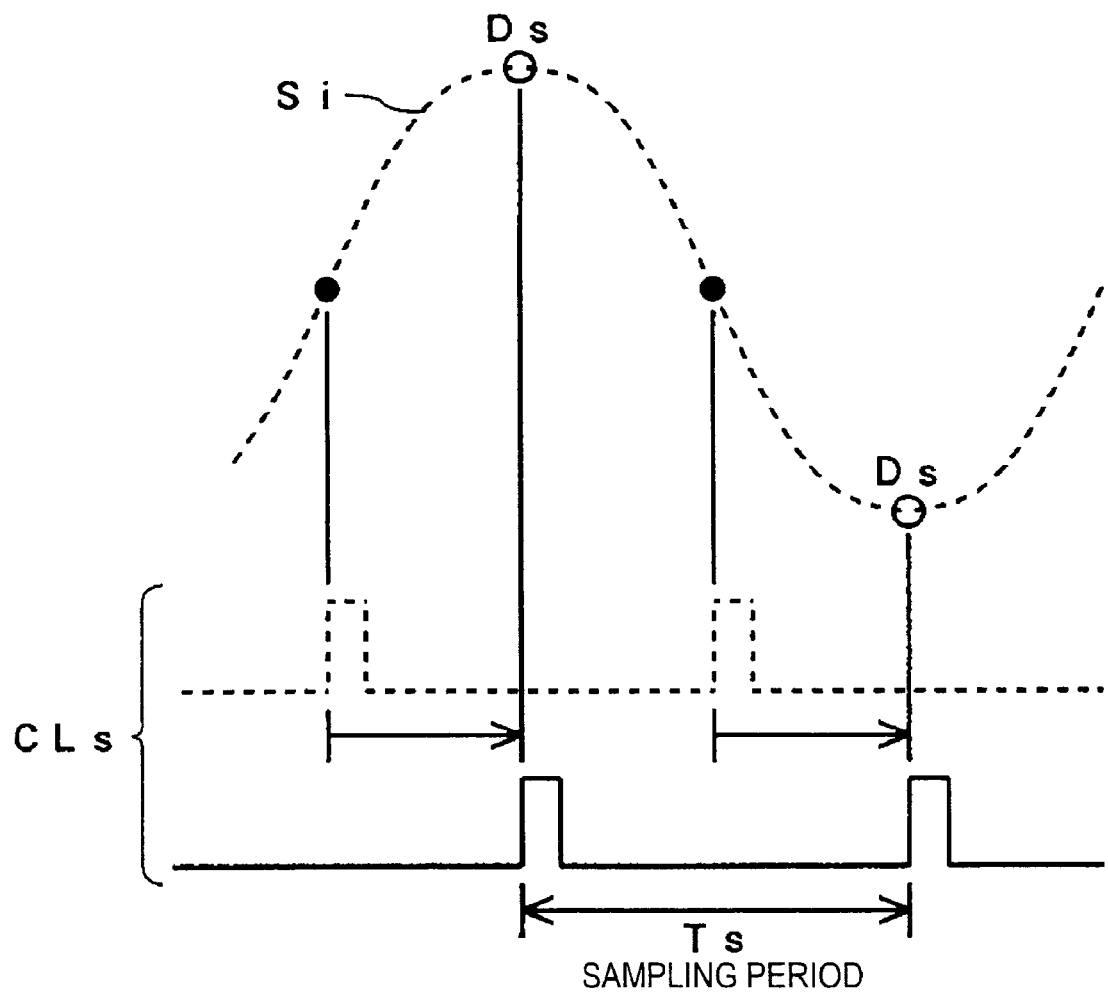
FIG. 17 is an illustration for explaining the apparatus shown in FIG. 16.
Figure 18:
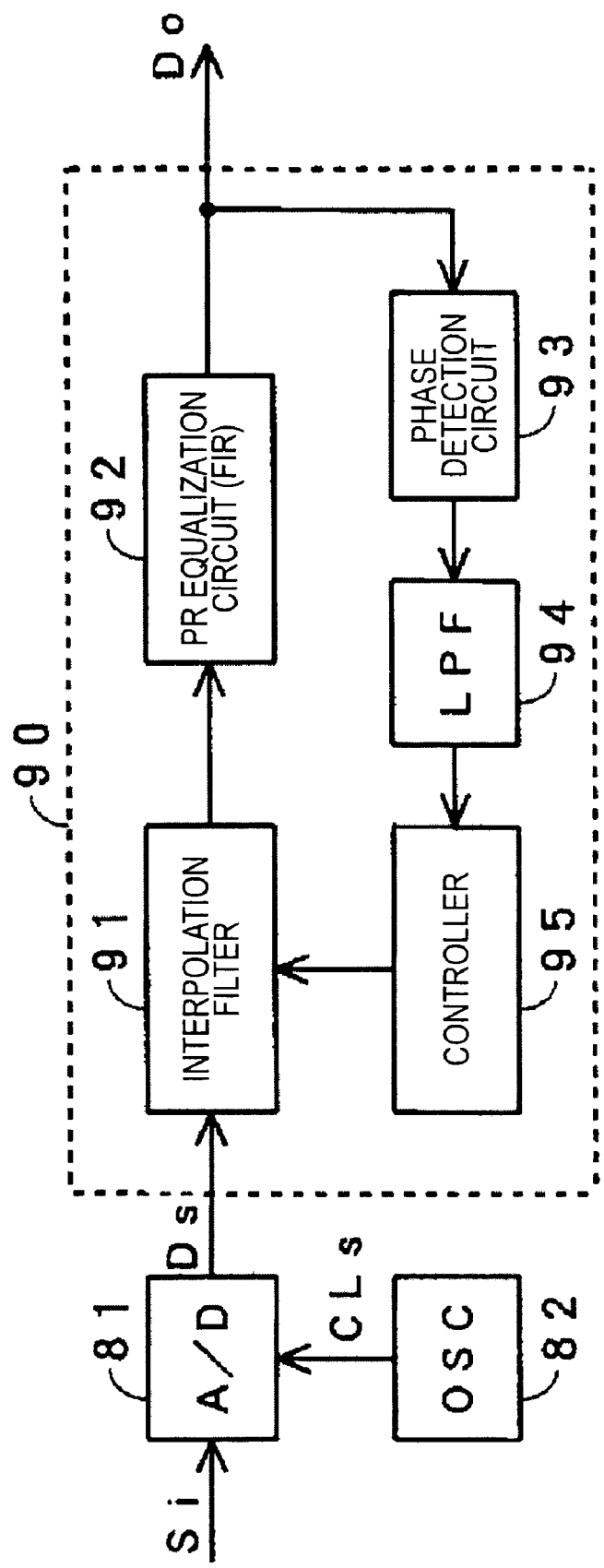
FIG. 18 shows a known ITR data reproducing apparatus.
Figure 19:
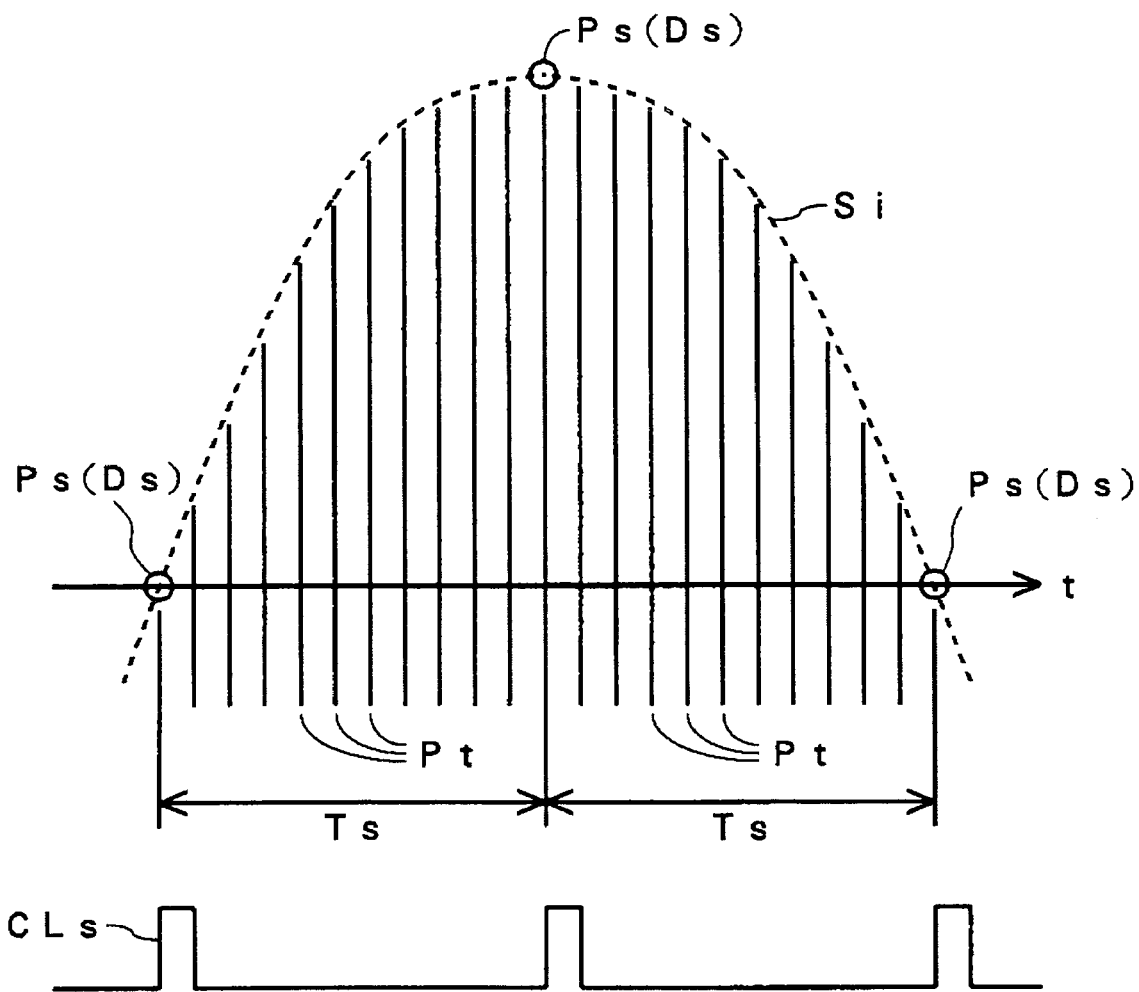
FIG. 19 is an illustration for explaining the apparatus shown in FIG. 18.

(Verification of Advantage of Split Linear Interpolation: FIG. 15)

A result of simulation of performance by applying split linear interpolation according to the present invention to reproduction waveforms for optical recording/reproduction is shown in FIG. 15.

This result is obtained by generating a reproduction waveform without noise from an impulse response having an ideal reproduction characteristic of a BD (Blu-ray Disc™) optical disc, by performing 1.05-fold oversampling, and by locking a PLL using ITR. Here, equalization is performed based on PR (1,1,1), and the resolution of sampling timing is 64.

Identification points of the ideal PR (1,1,1) equalization eye pattern are $\{-3, -1, +1, +3\}$. Variances of differences between data values of the identification points based on simulation and data values of the identification points obtained by ideal equalization with respect to +1 represented using dB are represented as an SDNR (Signal and Distortion to Noise Ratio) on the vertical axis. Thus, an identification point is reproduced closer to PR (1,1,1) as the value of the SDNR increases.

For ITR, the fact that a data reproduction characteristic of an interpolation filter is deteriorated means that the SDNR of data after interpolation is low (deteriorated). In a case where a sinc function is used as an interpolation function, if the number of taps in an interpolation filter increases, the SDNR tends to be saturated. In the saturation region, interpolation can be performed with high accuracy.

A horizontal axis represents the number of taps of the interpolation filter and corresponds to L in the example described above.

In FIG. 15, "sinc+Hanning" plotted using diamond-shaped symbols shows a case where tap coefficients of an interpolation filter are calculated directly using a sinc function as an interpolation function, as shown, in document 2. In this case, using a larger number of taps, such as ten or more, can increase the SDNR.

Here, PL represents the number N of splits, as described above. However, PL=1 represents a case where linear interpolation is performed without splitting a sampling period Ts, as described in document 3, instead of performing split linear interpolation satisfying the condition $N \geq 2$. In this case, even if the number of taps increases, the SDNR does not exceed a predetermined value.

In contrast, PL=2, PL=4, PL=8, PL=16, PL=32, and PL=64 represent cases where the condition $N=2^M$ is satisfied, as shown in condition (1) for split linear interpolation according to the present invention.

In this case, even when PL is 2, that is, even when the number N of splits is 2, the SDNR can be satisfactorily higher than a case where PL is 1. In addition, when PL is 4, that is, when the number N of splits is 4, if the number of taps is sixteen or more, a performance equivalent to a case where a tap coefficient is calculated directly from a sinc function can be achieved.

A case where PL is 8, PL is 16, Pl is 32, or PL is 64, is almost the same as a case where PL is 4, theses cases are plotted using circle symbols.

As described above, according to split linear interpolation according to the present invention, even with a relatively small number of splits, performance can be significantly improved compared with known linear interpolation. Thus, a data reproduction characteristic closer to an ideal characteristic can be achieved.

In addition, for example, when tap coefficients of nine taps are calculated directly from a sinc function using sampling timing based on a resolution of sixty-four levels, as shown in document 2, even if the symmetric property of the sinc function is taken into consideration, $((9-1)/2+1) \cdot 64 = 320$ table values are required. Thus, a large capacity is required as a memory table.

In contrast, according to split linear interpolation of the present invention, if the number N of splits is four, only twenty-one table values are required, as described above. Thus, the capacity of the memory table can be significantly reduced. In addition, when the ITR section 20 is configured as an IC (integrated circuit), the chip size can be reduced.

Other Embodiments

Although an example in a case where the A/D converter circuit 14 performs oversampling is described above, the present invention can also be applied to a case where split linear interpolation and calculation and updating of sampling timing $\mu k$ are performed in the interpolation filter 21 or a case where the sampling rate fs in the A/D converter circuit 14 is synchronized with the original data rate fi included in a reproduction waveform Si.

In addition, ITR data reproduction according to the present invention is not necessarily limited to magnetic recording/playback or optical recording/playback. The ITR data reproduction according to the present invention is also applicable to a case where a receiving side reproduces data in communication using a modem or the like.

The invention claimed is:

1. An ITR (Interpolated Timing Recovery) data reproducing apparatus that reproduces a data value at an original data identification point by capturing input sampling data into an interpolation filter and by performing interpolation including a convolution operation on the input sampling data and a tap coefficient of the interpolation filter, wherein the interpolation filter splits a data sampling interval of an interpolation function into N, which represents an integer of two or more, and calculates interpolation data by performing linear interpolation for each of the split periods, wherein sampling timing in the interpolation filter is represented by binary data and each of the split periods is identified in accordance with higher M bits of the binary data when a condition N=2^M is satisfied, where M represents an integer of one or more.

2. The ITR data reproducing apparatus according to claim 1, wherein the interpolation function is a sinc function.

3. The ITR data reproducing apparatus according to claim 1, wherein the interpolation function is a polynomial function.

4. A recording/reproducing system comprising the ITR data reproducing apparatus as set forth in any one of claims 1 to 3.

5. An interpolation filter that splits a certain time of period of an interpolation function into N, which represents an integer of two or more, and that calculates interpolation data by performing linear interpolation for each of the split periods, wherein interpolation timing in the interpolation filter is represented by binary data and each of the split periods is identified in accordance with higher M bits of the binary data when a condition N=2^M is satisfied, where M represents an integer of one or more.

6. The interpolation filter according to claim 5, wherein the interpolation function is a sinc function.

7. The interpolation filter according to claim 5, wherein the interpolation function is a polynomial function.

8. An ITR (Interpolated Timing Recovery) data reproducing apparatus that reproduces a data value at an original data identification point by capturing input sampling data into an interpolation filter and by performing interpolation including a convolution operation on the input sampling data and a tap coefficient of the interpolation filter, wherein in order to cause sampling timing for determining the tap coefficient to fit within timing defined within a data sampling interval, only a binary integer representation part is extracted, instead of actually performing a division operation, as a quotient obtained by performing integer division of updated sampling timing with a data sampling interval, and only the input sampling data for a number of the binary integer representation part is captured into the interpolation filter to operate a pipeline.

9. The ITR data reproducing apparatus according to claim 8, wherein only a binary fraction representation part is extracted, instead of actually performing a remainder operation, as a remainder obtained by performing the integer division of the updated sampling timing with the data sampling interval, and the tap coefficient is determined in accordance with the extracted value, which is used as sampling timing.

10. A phase interpolation filter comprising:

a holding unit that holds a plurality of discrete values at points in time obtained by splitting a sampling period of a predetermined interpolation function;

linear interpolation units that perform linear interpolation between the discrete values held in the holding means using a value for phasing; and a calculation unit that supplies to a predetermined FIR tap coefficients generated by the respective linear interpolation units prepared for the respective tap coefficients of the FIR, wherein a phase of an input waveform is complemented by convoluting the input waveform by the FIR using the tap coefficients supplied from the calculation unit.

* * * * *